(12) United States Patent  
Koshikawa et al.

(10) Patent No.: US 7,034,295 B2
(45) Date of Patent: Apr. 25, 2006

(54) PHOTOEMISSION ELECTRON MICROSCOPY AND MEASURING METHOD USING THE MICROSCOPY

(75) Inventors: Takanori Koshikawa, Nara (JP); Takashi Ikuta, Osaka (JP); Tsuneo Yasue, Osaka (JP); Masami Taguchi, Kanagawa (JP); Ibuki Tanaka, Kanagawa (JP)

(73) Assignees: ULVAC-PHI, Inc., Kanagawa (JP); Takanori Koshikawa, Nara (JP)

( * ) Notice: Subject to any disclaimer, the term of this patent is extended or adjusted under 35 U.S.C. 154(b) by 0 days.

(21) Appl. No.: 10/937,337

(22) Filed: Sep. 10, 2004

(65) Prior Publication Data

US 2005/0067566 A1 Mar. 31, 2005

(30) Foreign Application Priority Data

Sep. 29, 2003 (JP) ............................... 2003-338474

(51) Int. Cl.
*H01J 37/285* (2006.01)
(52) U.S. Cl. .................. 250/306; 250/307; 250/492.2; 250/504 R; 250/365; 382/145; 382/149
(58) Field of Classification Search ............. 250/492.2, 250/306, 307, 504 R, 365; 382/145, 149
See application file for complete search history.

(56) References Cited

U.S. PATENT DOCUMENTS 6,583,876 B1 * 6/2003 Opsal et al. ................ 356/369

6,671,398 B1 * 12/2003 Reinhorn et al. ........... 382/145

FOREIGN PATENT DOCUMENTS

JP 2000-215841 8/2000

* cited by examiner

*Primary Examiner*—Nikita Wells
(74) *Attorney, Agent, or Firm*—Arent Fox PLLC

(57) ABSTRACT

A photoemission electron microscopy having a light source system for carrying out a high-resolution measurement such as work function distribution measurement or magnetic domain distribution with reliability, and a high-sensitivity measurement method using the photoemission electron microscopy. A photoemission electron microscopy having an excitation light source system in which a specimen is irradiated with irradiation light from a light source uses a vacuum chamber in which the specimen is placed and an objective lens which collects the irradiation light on a specimen surface. The objective lens is accommodated in the vacuum chamber. The light source may be placed outside the vacuum chamber. A condenser lens which makes the irradiation light from the light source generally parallel may be placed between the light source and the vacuum chamber. A transmission window which transmits the irradiation light while the vacuum chamber is sealed may be placed between the condenser lens and the objective lens. If a diffraction grating for selecting the wavelength of the irradiation light or a polarizing filter for selecting the direction of circularly polarized light in the irradiation light is used between the condenser lens and the transmission window, a high-resolution measurement of a work function distribution or a magnetic domain distribution on the specimen surface can be carried out.

9 Claims, 5 Drawing Sheets (Prior)

(Prior)

4.1 eV (Incident light)

4.3 eV (Incident light)

PHOTOEMISSION ELECTRON MICROSCOPY AND MEASURING METHOD USING THE MICROSCOPY

BACKGROUND OF THE INVENTION

1. Field of the Invention

The present invention relates to a photoemission electron microscopy and, more particularly, to a light source system for a photoemission electron microscopy. Further, the present invention relates to a measuring method using a photoemission electron microscopy having the light source system. The photoemission electron microscopy (PEEM) is capable of observing the state of a specimen surface by utilizing a photoemissive effect. The principle of a light source system for an X-ray photoemission electron microscopy (XPEEM) categorized as a different device because of radiation of different kind of electromagnetic wave is the same as the light source system for the photoemission electron microscopy. In this sense, the light source system used in the present invention comprises that for an X-ray photoemission electron microscopy (XPEEM).

2. Description of the Related Art

A measurement using a photoemission electron microscopy (PEEM) is carried out by observing a contrast image of a specimen surface such as a metal formed from low energy electrons generated when the specimen surface is irradiated with light from a mercury lamp, light from a deuterium lamp, and the like. The principle of this measurement is utilization of a phenomenon in which when the specimen surface is irradiated with light having energy equal to or higher than the work function of constituent atoms of the specimen surface, photoelectron emission relating to the work function is caused by the photoemissive effect. If an atomic structural non-uniformity or adsorption molecules and the like exist in a specific area on the specimen surface, local variation in the amount of generated photoelectrons due to such a condition is obtained as a contrast image corresponding to the work function distribution.

Also, when a polarizing filter is inserted in a light source system constituted between a light source for excitation and a specimen surface, a measurement of a magnetic domain distribution using magnetic dichroism can be made.

As this kind of microscopic apparatus, inventions of multi-emission electron microscopic apparatuses for chemical analysis using a photoemission electron microscopy (PEEM) or an X-ray photoemission electron microscopy (XPEEM) have been disclosed (see Patent Document 1 for example).

[Patent Document 1] Japanese Patent Laid-Open No. 2000-215841 (page 2, FIG. 1).

In some cases, mercury lamp light (5.1 eV), deuterium lamp light (6.9 eV) or light having the same energy is used as an excitation light source for a photoemission electron microscopy (PEEM). FIG. 1 shows the outline of a light source system between from an excitation light source to a specimen surface in a conventional photoemission electron microscopy (PEEM).

Referring to FIG. 1, light rays in an ultraviolet wavelength region emitted from a light source 1 formed of a mercury lamp are made parallel through a condenser lens 2 formed of a pair of aspherical lenses, exit outside a light source housing 4 after passing through an additional lens 3, and are irradiated on a specimen surface 7 through a transmission window 6 corresponding to an incident path of a vacuum chamber 5 maintained at $10^{-7}$ Pa or lower by an ultra high vacuum pumping mechanism (not shown). At the time of irradiation with the ultraviolet rays, photoelectron emission related to the work function is caused by the photoemissive effect, as described above. Photoelectrons thereby emitted form an image on a fluorescent screen through an optical system which is constructed with a cathode lens, a contrast aperture, a projection lens, a multichannel plate (MCP) (each not shown) to enable imaging on the fluorescent screen with low energy electrons emitted.

FIG. 2 shows the result of analysis of the amount of collection of light with which a 200 μm square specific area 8 formed on the specimen surface 7 was irradiated using the light source system shown in FIG. 1. This analysis was made by computer simulation. As can be visually recognized from FIG. 2, the collecting effect of the light source system shown in FIG. 1 is low and the rate of collection on the specific area 8 is about 0.1% of the total amount of light emitted from the light source 1 shown in FIG. 1.

This is the reason that general-purpose industrial lamps for uniformly irradiating a comparatively large area are used as various ultraviolet light sources of actual models. Therefore, it is difficult to obtain irradiation light with a sufficiently high luminance on the specimen surface in the conventional system. In particular, in a case where a diffraction grating for separating and sweeping irradiation light in measurement of surface distribution of a work function, or the above-mentioned polarizing filter for measurement of a magnetic domain distribution is added to the optical path as light source system components, a further reduction in luminance is caused as a considerable hindrance to real-time measurement at the desired resolution. That is, in order to compensate the reduction in luminance, a longer time is required for measurement, which makes it difficult to carry out real-time measurement.

On the other hand, it arises another problem to increase the luminance of the light. In the conventional system, irradiation light reaches a wide area extending outside the specific area having a diameter of about 200 μm. Therefore, when the luminance is increased, gas emission from a portion of the specimen surface other than the measured portion and from the specimen holder heated by light occurs to cause a reduction in the degree of vacuum in the vicinity of the specimen surface. If a contamination occurs such that the clean environment in the vicinity of the specimen surface is impaired as described above, it is impossible to perform observation, for example, for the purpose of real-time measurement of gas adsorption to the specimen surface.

SUMMARY OF THE INVENTION

In view of the above-described problem, an object of the present invention is to provide a photoemission electron microscopy (PEEM) having a light source system for reliably carrying out a high-resolution measurement such as distribution measurement of a work function or distribution measurement of a magnetic domain, and a method for high-sensitivity measurement with the photoemission electron microscopy.

To achieve the above-described object, according to the present invention, there is provided a photoemission electron microscopy having an excitation light source system in which a specimen is irradiated with irradiation light from a light source, the microscopy having a vacuum chamber in which the specimen is placed, and an objective lens which collects the irradiation light on a specimen surface, the objective lens being accommodated in the vacuum chamber.

In this microscopy, irradiation light can be collected in a spot size about a specific area on the specimen surface by the objective lens provided between the light source and the specimen surface to obtain irradiation light with a high luminance in the specific area. Even if a diffraction grating or a polarizing filter is additionally placed, irradiation light can be obtained with a sufficiently high luminance. Therefore, a measurement of a work function distribution and a measurement of a magnetic domain distribution can be carried out by using the photoemission electron microscopy.

At least the objective lens and the specimen in the components of the light source system between from the light source to the specimen surface are placed in one vacuum chamber in which ultrahigh vacuum at below $10^{-7}$ Pa is maintained, thereby enabling the objective lens to be placed close to the specimen surface. The degree of freedom of the positional relationship between the objective lens and the specimen is increased. Therefore, the irradiation efficiency of the specimen surface from the light source can be improved and factors responsible for occurrence of contamination in the vicinity of the specimen surface can be reduced.

Because light can be obtained with higher luminance, the amount of generated photoelectrons is increased to facilitate dynamic and real-time observation. Therefore, a high-sensitivity measurement using high resolution can be carried out with reliability.

In a case where only the objective lens and the specimen surface are placed as light source system components accommodated in one vacuum chamber and the light source is placed outside the chamber, the photoemission electron microscopy further comprises an additional arrangement in which a condenser lens for making the irradiation light from the light source generally parallel is placed between the light source and the vacuum chamber and a transmission window through which the irradiation light passes while the vacuum chamber is sealed is placed between the condenser lens and the objective lens.

In this arrangement, the condenser lens is placed to improve the irradiation efficiency with the irradiation light and the volume of the vacuum chamber is reduced to improve the evacuation efficiency.

An adjustment means for adjusting a characteristic of the irradiation light may be additionally placed between the condenser lens and the transmission window to select the irradiation light having the desired characteristic in such a manner that irradiation light having a particular wavelength is separated or irradiation with polarized light is performed. That is, a diffraction grating which selects the wavelength of irradiation light may be used as this adjustment means to enable measurement of a work function on the specimen surface. Also, a polarizing filter which selects the direction of circularly polarized light in the irradiation light may be used to enable distribution measurement of a magnetic domain.

The irradiation light separated as described above may be radiated to the specimen surface with particular wavelengths at predetermined intervals to enable distribution measurement of a work function on the surface. In such a case, a light source capable of emitting rays with a wavelength in a particular range in a wide wavelength band (e.g., a 150 to 800 nm wavelength band) may be used as an excitation light source and a device using a diffraction grating to select the wavelength (a monochrometer and the like) may be used as the adjustment means. The arrangement may alternatively be such that a plurality of light sources respectively emitting single-wavelength rays differing in wavelength from each other are used and each of the plurality of light sources is placed so as to be selectable.

In either case, irradiation light with a single wavelength at the specimen surface is separated from irradiation light with a plurality of wavelengths and the separated irradiation light is selectively changed to enable a measurement to be carried out while changing the wavelength.

That is, irradiation light continuously changed in wavelength is radiated with each of wavelengths corresponding to predetermined wavelength intervals to obtain a contrast image with respect to each wavelength of the irradiation light, i.e., each energy of the irradiation light. From a change in this contrast image, the work function with respect to each wavelength can be obtained.

As an actual light source, a mercury lamp, a deuterium lamp, a lamp equivalent to the mercury lamp or the hydrogen lamp or a combination of any of such lamps may be used.

By using the above-described light source system, maintenance of high-luminance irradiation light, high irradiation efficiency and limitation of contamination of the clean surface are realized to improve the work function measurement sensitivity in comparison with the conventional art. Therefore, a measuring method using a photoemission electron microscopy (PEEM) having the above-described light source system, and including a step of collecting irradiation light from the light source by means of the objective lens and irradiating the specimen with the collected irradiation light, a step of selecting a wavelength of the irradiation light by means of the diffraction grating, and a step of enabling photoelectrons emitted from the specimen in correspondence with the wavelength to form an image enables not only the conventional distribution measurement of a work function using a contrast image but also numerical indication of a work function distribution on the specimen surface.

The above-described light source system whereby maintenance of high-luminance irradiation light, high irradiation efficiency and limitation of contamination of the clean surface can be realized may be further provided with a polarizing filter to enable distribution measurement of a magnetic domain on the specimen surface using magnetic polarization dichroism. That is, a contrast difference can appear more sharply in a magnetic domain distribution image obtained by a measuring method using the photoemission microscopy (PEEM) having the light source system with a polarizing filter, and including a step of collecting irradiation light from the light source by means of the objective lens and irradiating the specimen with the collected irradiation light, a step of selecting one of anticlockwise and clockwise directions of circularly polarized light in the irradiation light by means of the polarizing filter, and a step of enabling photoelectrons emitted from the specimen in correspondence with the anticlockwise or clockwise circularly polarized light. Therefore, the present invention can be adapted to a measurement of a memory device and the like which needs to be measured in a fine magnetic domain size in accordance with the recent improvement in degree of integration.

The light source system of the present invention has at least the objective lens and the specimen surface placed in one ultra-high vacuum system, is, therefore, capable of realizing maintenance of high-luminance irradiation light, high irradiation efficiency and limitation of contamination of the clean surface, and ensures a high-resolution high-sensitivity measurement with reliability as well as dynamic and real-time observation of the specimen surface.

Therefore, the photoemission electron microscopy (PEEM) having this light source system is capable of indication of the state of distribution of a work function with an absolute value as well the conventional distribution measurement of a work function using a contrast image.

Also, the photoemission electron microscopy (PEEM) having this light source system with a polarizing filter is capable of obtaining, even in the case of distribution measurement of a magnetic domain on the specimen surface using magnetic polarization dichroism, a measured in which a contrast difference appears more sharply due to an improvement in sensitivity.

BRIEF DESCRIPTION OF THE DRAWINGS

FIG. 7($b$) is an image showing a work function distribution in the spectroscopic imaging mode in the case of 4.3 eV incident light;

FIG. 8($b$) is a contrast image showing a Co atom magnetic domain distribution.

DESCRIPTION OF REFERENCE NUMERALS

Figure 1:
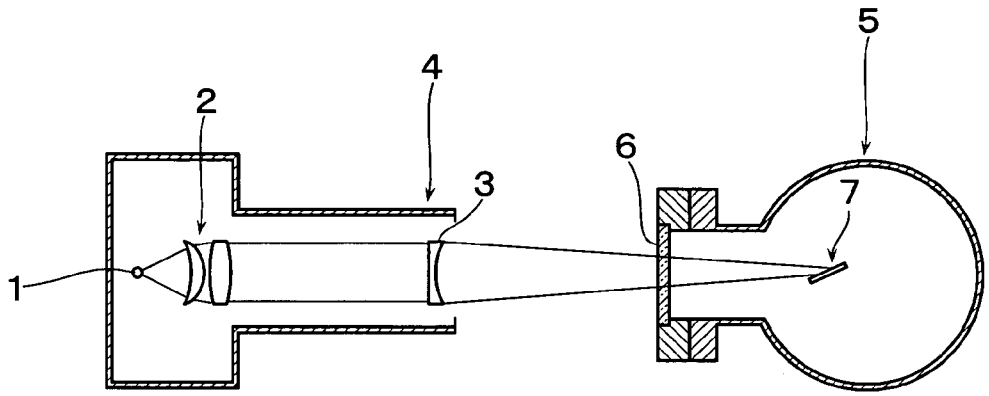
FIG. 1 is a diagram schematically showing a conventional light source system in a photoemission electron microscopy.
Figure 2:
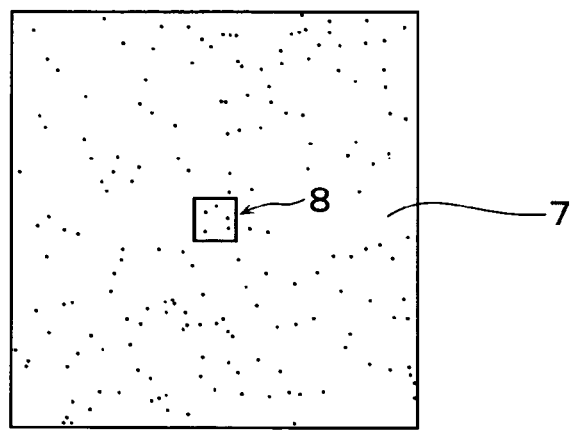
FIG. 2 is a simulation analysis diagram showing collection of light by the light source system shown in FIG. 1.

1 Light source
2 Condenser lens
5 Vacuum chamber
6 Transmission window (Vacuum sealed)
7 Specimen
8 Specific area
32 Objective lens
53 Photoemission electron microscopy (PEEM) chamber

DETAILED DESCRIPTION OF THE PREFERRED EMBODIMENTS

Figure 3:
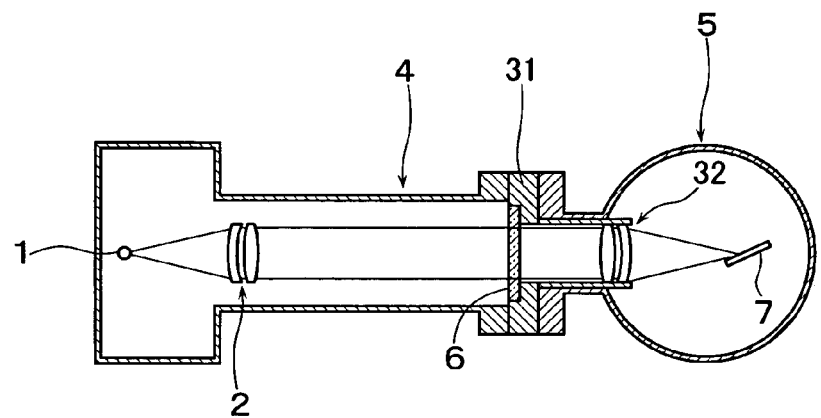
FIG. 3 is a diagram schematically showing a light source system in a photoemission electron microscopy in accordance with the present invention.

FIG. 3 is a diagram schematically showing a light source system in a photoemission electron microscopy (PEEM) in accordance with the present invention. Light rays in an ultraviolet wavelength region emitted from a light source 1 which is a mercury lamp, a deuterium lamp or a lamp equivalent to the mercury or deuterium lamp are made parallel by a condenser lens 2 formed of a pair of aspherical lenses. The parallel rays travel through a light source housing 4, pass through a vacuum sealed transmission window 6, and travel in a vacuum chamber 5, finally are irradiated on a specimen surface 7 by being collected on the surface by an objective lens 32. The transmission window 6 is provided in a vacuum viewing flange 31 between the light source housing 4 and the vacuum chamber 5 maintained in a ultrahigh vacuum pressure condition of below $10^{-7}$ Pa by an ultrahigh vacuum pumping mechanism (not shown). The transmission window 6 is formed of a quartz window in the form of a flat plate. Therefore, the path in which the ultraviolet rays made parallel by the condenser lens 2 travel to the objective lens 32 is not changed by the transmission window 6 and the ultraviolet rays can enter the objective lens 32 in a state of being maintained as parallel rays.

Figure 4:
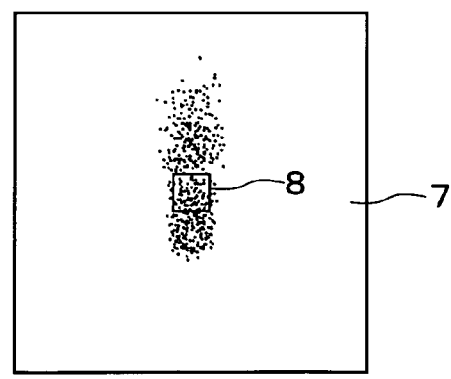
FIG. 4 is a simulation analysis diagram showing collection of light by the light source system shown in FIG. 3.

FIG. 4 shows the result of analysis of the amount of collection of light with which a 200 μm square specific area 8 formed on the specimen surface 7 was irradiated when the light source system formed from the light source 1 to the specimen surface 7 as shown in FIG. 3 was used. This analysis was made by computer simulation. The rate of collection of light on the specific area 8 was improved by about 14% of the total amount of light emitted from the light source 1 shown in FIG. 3. The luminance of ultraviolet rays radiated to the specimen surface is thereby increased in comparison with the conventional art. Therefore, even when a diffraction grating (monochrometer) for work function measurement or a polarizing filter for magnetic domain distribution measurement is added between the condenser lens 2 and the transmission window 6, an image can be formed so as to sharply exhibit a contrast difference. This effect is obtained by maintenance of high-luminance of irradiation light by condensation, an improvement in irradiation efficiency achieved by reducing the distance between the specimen surface and the lens positioned closer to the specimen surface, limitation of contamination of the clean surface in an ultrahigh vacuum environment, and other factors, thus enabling photoemission electron microscopy (PEEM) observation at a high resolution.

As a prerequisite for observation of the above-described photoemission electron microscopy (PEEM) observation, light of a single wavelength is provided as the irradiation light from the light source 1 shown in FIG. 3. For measurement of a work function distribution on the specimen surface 7 and the like, a procedure is required in which irradiation light of a plurality of wavelengths or irradiation light having a continuous wavelength distribution is divided at predetermined wavelength intervals and the divided light is radiated to the specimen surface with each of the wavelengths corresponding to the wavelength intervals. As the light source 1 shown in FIG. 3, therefore, a light source capable of emitting rays in a wavelength range from 150 to 800 nm or with a predetermined wavelength in this range. Any particular wavelength in this wide wavelength range can be selected by a monochrometer (not shown) provided between the condenser lens 2 and the transmission window 6.

The arrangement may be such that the light source 1 is constituted by a plurality of light sources each of which emits single-wavelength rays and selection is freely made between the plurality of light sources to separate and change irradiation light as described above.

For the distribution measurement of magnetic domain with the microscopic apparatus having the light source system shown in FIG. 3, magnetic circular dichroism (MCD) is used. For example, in a case where X-rays are used as light rays, X-ray magnetic circular dichroism (XMCD) is used. The X-ray magnetic circular dichroism enables anticlockwise circularly polarized light and clockwise circularly polarized light to be selectively extracted by using an aperture moving perpendicularly to the beam direction. When such a polarizing filter and the photoemission electron microscopy are combined, a magnetic domain surface distribution can be obtained as a contrast image. That is, for magnetic domain measurement, split of the pair of spin functions unique to constituent atoms of the specimen surface when a magnetic field is applied to the atoms is utilized. A surface distribution can be observed as a differential image of a sharp contrast image appearing when the energy at the corresponding to the absorption ends is excited by X-ray magnetic circular dichroism (XMCD).

Figure 5:
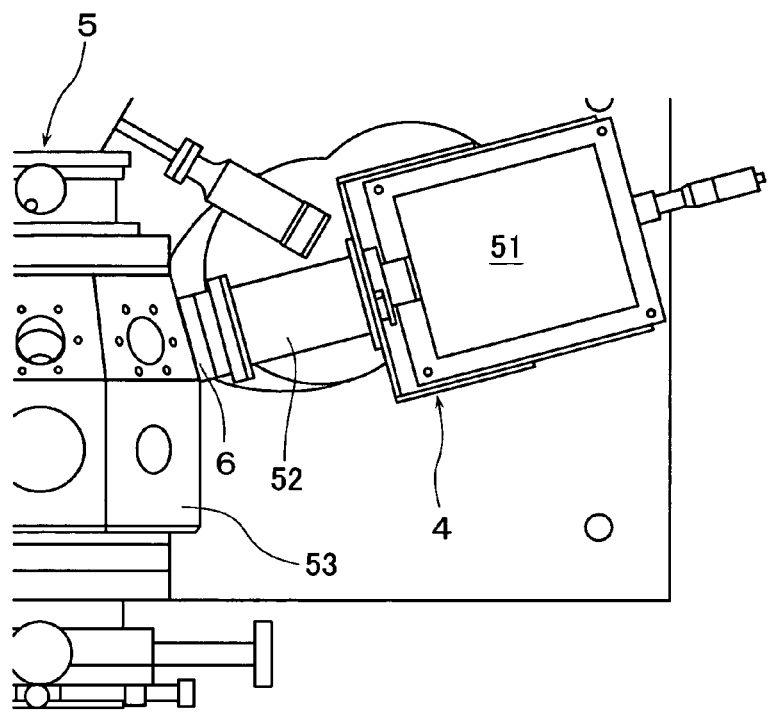
FIG. 5 is a top view of the photoemission electron microscopy (PEEM) of the present invention.
Figure 6:
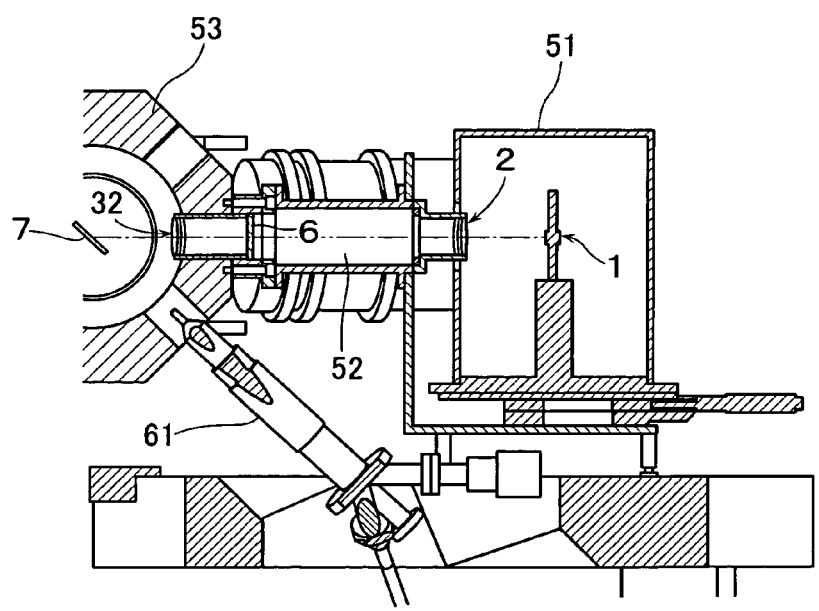
FIG. 6 is a front sectional view of the photoemission electron microscopy (PEEM) of the present invention.

FIGS. 5 and 6 are a top view and a front sectional view, respectively, of a photoemission electron microscopy (PEEM) having the above-described light source system. Referring to FIG. 5, a light source housing 4 is constituted by a mercury lamp housing 51 and a transfer tube 52, and ultrahigh vacuum of below $10^{-7}$ Pa is maintained in a photoemission electron microscopy (PEEM) chamber 53. The transfer tube 52 and the photoemission electron microscopy (PEEM) chamber 53 are connected with a quartz transmission window 6 interposed therebetween.

Referring to FIG. 6, a mercury lamp 1 and a condenser lens 2 are placed in the mercury lamp housing 51 on one optical axis, and the quartz transmission window 6 is placed on an extension of the optical axis in the transfer tube 52. A specimen 7 is placed on an extension of the optical axis in the photoemission electron microscopy (PEEM) chamber 53. Low energy electrons emitted from a specimen surface 7 travel through an optical system 61 to form an image.

A diffraction grating (monochrometer) for work function measurement is provided in the transfer tube 52. In a case where distribution measurement of magnetic domain is carried out, a polarizing filter is provided in the transfer tube 52.

The principle of a light source system for an X-ray photoemission electron microscopy (XPEEM) which differs only in the kind of electromagnetic wave from the above-described photoemission electron microscopy (PEEM) is the same as that of the light source for the photoemission electron microscopy (PEEM). Therefore the above-described light source system can be applied to a light source system for such an X-ray photoemission electron microscopy (XPEEM).

EXAMPLE 1

Figure 7A:
FIG. 7($a$) is an image showing work function distribution in a spectroscopic imaging mode in the case of 4.1 eV incident light.
Figure 7B:

A work function distribution on a specimen surface was obtained as a contrast image in each of a case where the photoemission electron microscopy (PEEM) having the light source system shown in FIG. 3 was used and the specimen surface was irradiated with incident light separated at 4.1 eV of energy by the monochrometer provided in the transfer tube (FIG. 7(a)) and a case where the same photoemission electron microscopy was used and the specimen surface was irradiated with incident light separated at 4.3 eV of energy (FIG. 7(b)). The measurement specimen is a Pb island on a W surface formed by Pb atoms deposited on the clean W(001) surface. At a portion observed as a difference (white exposed portion) between the images shown in FIGS. 7(a) and 7(b), the work function value on the specimen surface corresponds to 4.1 to 4.3 eV.

From this measurement, it can be understood that a sharp contrast image can be obtained in observation with the photoemission electron microscopy (PEEM) having the light source system in accordance with the present invention and, therefore, an absolute value indication of the work function can be given.

EXAMPLE 2

Figure 8A:
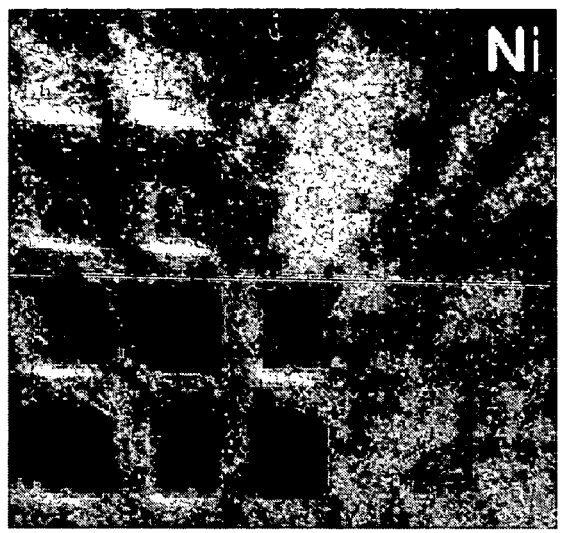
FIG. 8($a$) is a contrast image showing a Ni atom magnetic domain distribution.
Figure 8B:
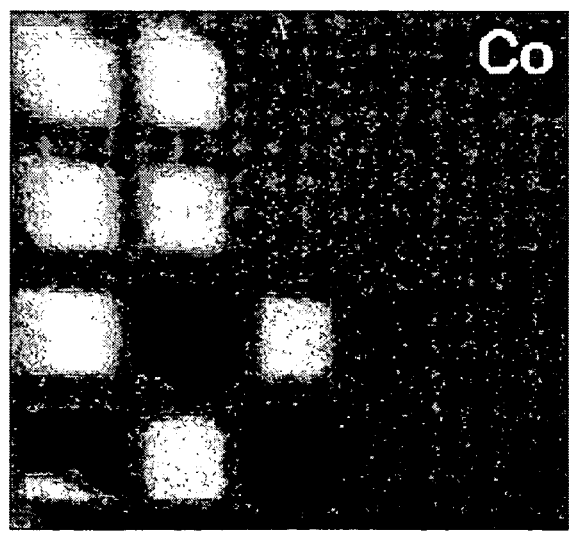

Pattern formation on a clean Cu (001) surface using Ni atoms in 8 single-atom layers and Co atoms in 15 single-atom layers was performed. Contrast images of a magnetic domain distribution obtained when an X-ray magnetic circular dichroism (XMCD)-photoemission electron microscopy (PEEM) apparatus was used and when the energy at the Ni atom and Co atom absorption ends was excited by X-ray magnetic circular dichroism (XMCD) are respectively shown in FIG. 8(a) (Ni atoms) and FIG. 8(b) (Co atoms).

From these contrast images, it can be understood that the magnetic domains of the atoms were clearly imaged.

The light source system for a photoemission electron microscopy (PEEM) in accordance with the present invention can be applied not only to light source systems for photoemission electron microscopy (PEEM) in a narrow sense but also to light source systems for X-ray photoemission electron microscopy (XPEEM) to improve the resolutions of these microscopy.

What is claimed is:

1. A photoemission electron microscopy having an excitation light source system in which a specimen is irradiated with irradiation light from a light source, said microscopy comprising:
    a vacuum chamber in which the specimen is placed;
    an objective lens which directly collects the irradiation light on a specimen surface, wherein said objective lens is accommodated in said vacuum chambers,
    wherein said light source is placed outside said vacuum chamber,
    a condenser lens which is placed between said light source and said vacuum chamber, and which makes the irradiation light from said light source generally parallel;
    a transmission window which is placed between said condenser lens and said objective lens, and which transmits the irradiation light while said vacuum chamber is sealed; and
    adjustment means for adjusting a characteristic of the irradiation light, said adjustment means being placed between said condenser lens and said transmission window.

2. The photoemission electron microscopy according to claim 1, wherein said adjustment means comprises a diffraction grating which selects a wavelength of the irradiation light.

3. The photoemission electron microscopy according to claim 1, wherein said adjustment means comprises a polarizing filter which selects a direction of circularly polarized light in the irradiation light.

4. The photoemission electron microscopy according to claim 1, wherein said light source comprises a set of a plurality of light sources respectively emitting single-wavelength rays differing in wavelength from each other, each of the plurality of light sources being placed so as to be selectable.

5. The photoemission electron microscopy according to claim 1, wherein said adjustment means comprises a diffraction grating which selects a wavelength of the irradiation light, said light source emits light rays so that rays with a particular wavelength in a wide wavelength band can be selected; and a work function distribution of each wavelength on the specimen surface is measured from a change in the photoemission electron contrast image with respect to the energy of the irradiation light corresponding to each wavelength while changing the wavelength of the irradiation light.

6. The photoemission electron microscopy according to claim 1, wherein said light source emits light rays so that rays with a particular wavelength in a wide wavelength band can be selected.

7. The photoemission electron microscopy according to claim 1, wherein said light source comprises at least one of a mercury lamp and a deuterium lamp.

8. A method of carrying out a measurement using said photoemission electron microscopy, said method comprising:
- a step of collecting irradiation light from said light source by means of said objective lens and directly irradiating the specimen with the collected irradiation light;
- a step of selecting a wavelength of the irradiation light by means of said diffraction grating; and
- a step of enabling photoelectrons emitted from the specimen in correspondence with the wavelength to form an image,
- wherein a numerical indication of a work function distribution for each wavelength on the specimen surface is given by a chance in a photoemission electron contrast image with respect to the energy of the irradiation light corresponding to each wavelength while changing the wavelength of the irradiation light; and
- the irradiation light is radiated onto the specimen surface through a transmission window placed between a condenser lens and an objective lens.

9. A method of carrying out a measurement using said photoemission electron microscopy, said method comprising:
- a step of collecting irradiation light from said light source by means of said objective lens and directly irradiating the specimen with the collected irradiation light;
- a step of selecting one of anticlockwise and clockwise directions of circularly polarized light in the irradiation light by means of said polarizing filter; and
- a step of enabling photoelectrons emitted from the specimen in correspondence with the anticlockwise or clockwise circularly polarized light,
- wherein a magnetic domain distribution on the specimen surface is measured; and
- wherein the irradiation light is radiated onto the specimen surface through a transmission window placed between a condenser lens and an objective lens.

* * * * *